United States Patent
Lauruhn et al.

(10) Patent No.: US 6,381,836 B1
(45) Date of Patent: *May 7, 2002

(54) CLIP AND PIN FIELD FOR IC PACKAGING

(75) Inventors: Jeff Lauruhn, Folsom; Duncan MacGregor, Shingle Springs, both of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/027,582
(22) Filed: Feb. 23, 1998
(51) Int. Cl.[7] .................................. H05K 3/20
(52) U.S. Cl. .............................. 29/831; 29/830; 29/832; 29/837; 165/80.3; 165/185; 174/16.3; 257/685; 257/686; 257/704; 257/710; 361/600; 361/679; 361/688
(58) Field of Search .................. 29/512, 837, 830, 29/831, 832; 165/80.3, 185, 122, 126; 174/16.3; 257/704, 705, 706, 718, 719, 712, 707, 685, 713, 686, 726, 727, 731, 710; 361/690, 600, 704, 679, 707, 710, 687, 688, 695, 697, 717, 718, 714, 747

(56) References Cited

U.S. PATENT DOCUMENTS

| | | | |
|---|---|---|---|
| 4,744,143 A | * | 5/1988 | Sadigh-Behzadi ........... 29/837 |
| 4,812,733 A | | 3/1989 | Tobey |
| 5,398,041 A | | 3/1995 | Hyatt |
| 5,424,913 A | * | 6/1995 | Swindler ..................... 361/687 |
| 5,432,526 A | | 7/1995 | Hyatt |
| 5,448,449 A | * | 9/1995 | Bright et al. ........... 361/704 X |
| 5,457,342 A | | 10/1995 | Herbst, II |
| 5,475,564 A | * | 12/1995 | Chiou ......................... 361/704 |
| 5,542,468 A | * | 8/1996 | Lin ....................... 165/80.3 X |
| 5,594,623 A | * | 1/1997 | Schwegler ................... 361/697 |
| 5,600,540 A | * | 2/1997 | Blomquist .............. 361/704 X |
| 5,619,399 A | * | 4/1997 | Mok ........................... 361/707 |
| 5,660,562 A | * | 8/1997 | Lin ........................ 439/487 X |
| 5,694,297 A | * | 12/1997 | Smith et al. ................. 361/785 |
| 5,703,753 A | * | 12/1997 | Mok ........................... 361/715 |
| 5,704,212 A | | 1/1998 | Erler et al. |
| 5,771,960 A | * | 6/1998 | Lin ............................ 165/80.3 |
| 5,864,465 A | * | 1/1999 | Liu ............................ 361/697 |
| 5,890,371 A | | 4/1999 | Rajasubramanian et al. |
| 5,934,079 A | | 8/1999 | Han et al. |

* cited by examiner

Primary Examiner—Joe H. Cheng
Assistant Examiner—Binh-An Nguyen
(74) Attorney, Agent, or Firm—Blakely, Sokoloff, Taylor & Zafman LLP

(57) ABSTRACT

An electronic assembly that incorporates a heat sink. The subassembly includes an integrated circuit package that is mounted to a substrate. The substrate is mounted to a spacer block which includes a pin field that contains a plurality of pins. The heat sink is coupled to the integrated circuit package by a clip that wraps around the sink and is attached to the spacer block.

20 Claims, 2 Drawing Sheets

CLIP AND PIN FIELD FOR IC PACKAGING

BACKGROUND OF THE INVENTION

1. Field of the Invention

The present invention relates to an electronic package assembly.

2. Description of Related Art

Integrated circuits are typically assembled to a package that is mounted to a printed circuit board. FIG. 1 shows an integrated circuit package 1 attached to a zero insertion force (ZIF) socket 2 which allows an end user to replace the package 1 with a new part. The socket 2 has a plurality of pins 3 that are soldered to a motherboard 4. Extending from the bottom surface of the integrated circuit package 1 are a plurality of external pins (not shown) that are plugged into the pin sockets 3. The pins and pin sockets 3 couple the package 1 to the board 4. The integrated circuit package 1 is inserted into a socket lid 5 that is laterally shifted by a cam lever 6 to couple the package to the pin sockets 3.

The integrated circuit within the package 1 generates heat which must be removed to maintain the junction temperatures of the circuit below threshold values. A heat sink 7 may be coupled to the socket 2 by a spring clip 8 that is attached to a tab 9.

It may be desirable to incorporate a fan into the electronic assembly shown in FIG. 1 to increase the thermal efficiency of the assembly. Attaching a fan to the heat sink would be impractical with the present spring clip arrangement.

SUMMARY OF THE INVENTION

The present invention is an electronic assembly that incorporates a heat sink. The assembly may include an integrated circuit package that is mounted to a substrate. The substrate may be mounted to a spacer block which includes a pin field that contains a plurality of pins. The heat sink may be coupled to the integrated circuit package by a clip that wraps around the sink and is attached to the spacer block.

DETAILED DESCRIPTION OF THE INVENTION

Figure 1:
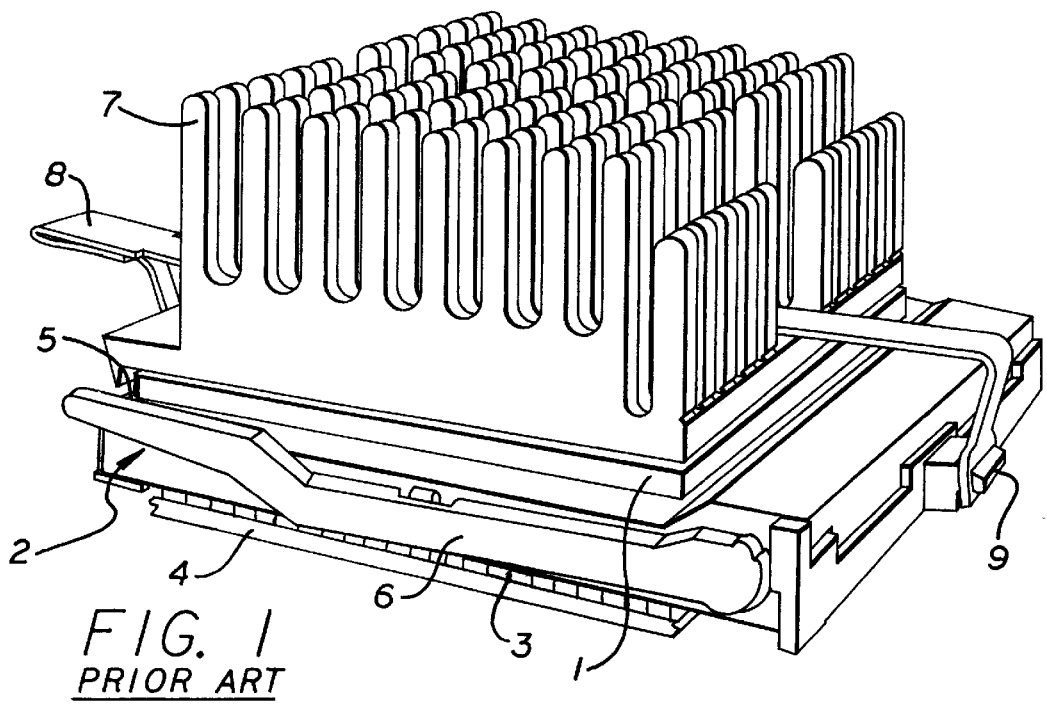
FIG. 1 is a perspective view of an integrated circuit ZIF socket assembly of the prior art.
Figure 2:
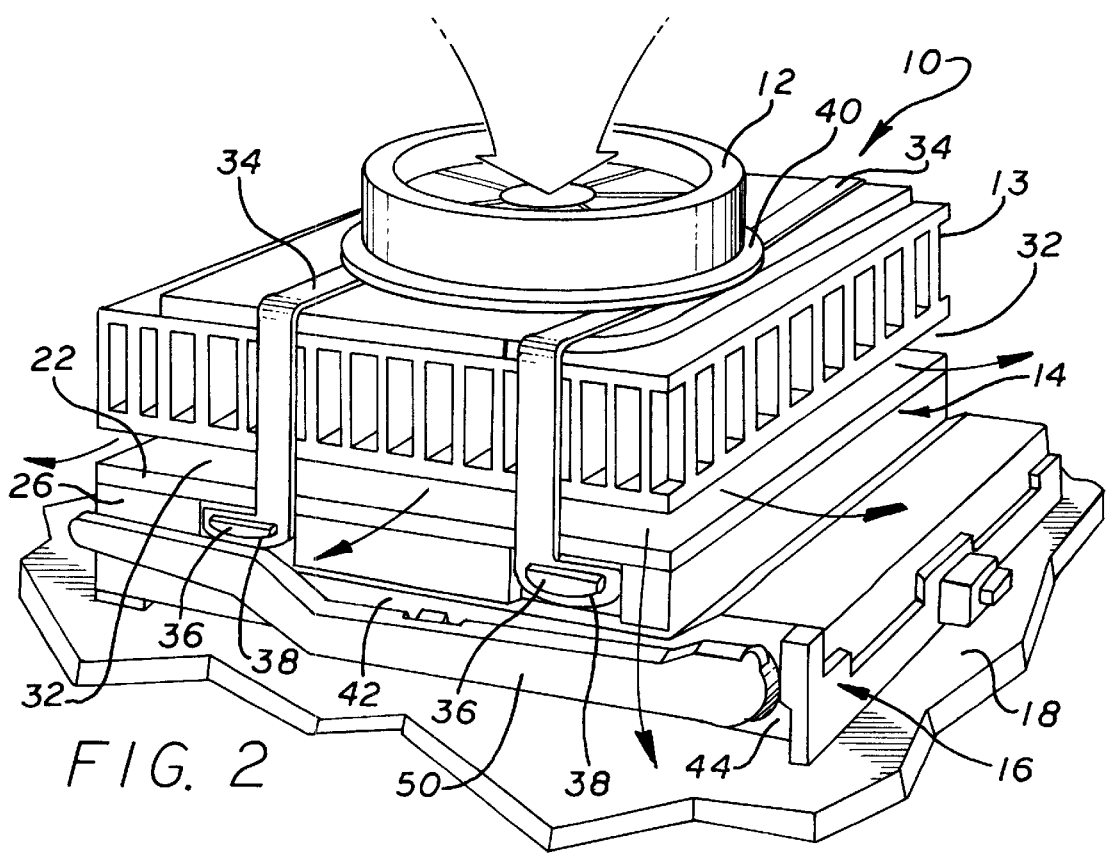
FIG. 2 is a perspective view of an electronic assembly of the present invention.
Figure 3:
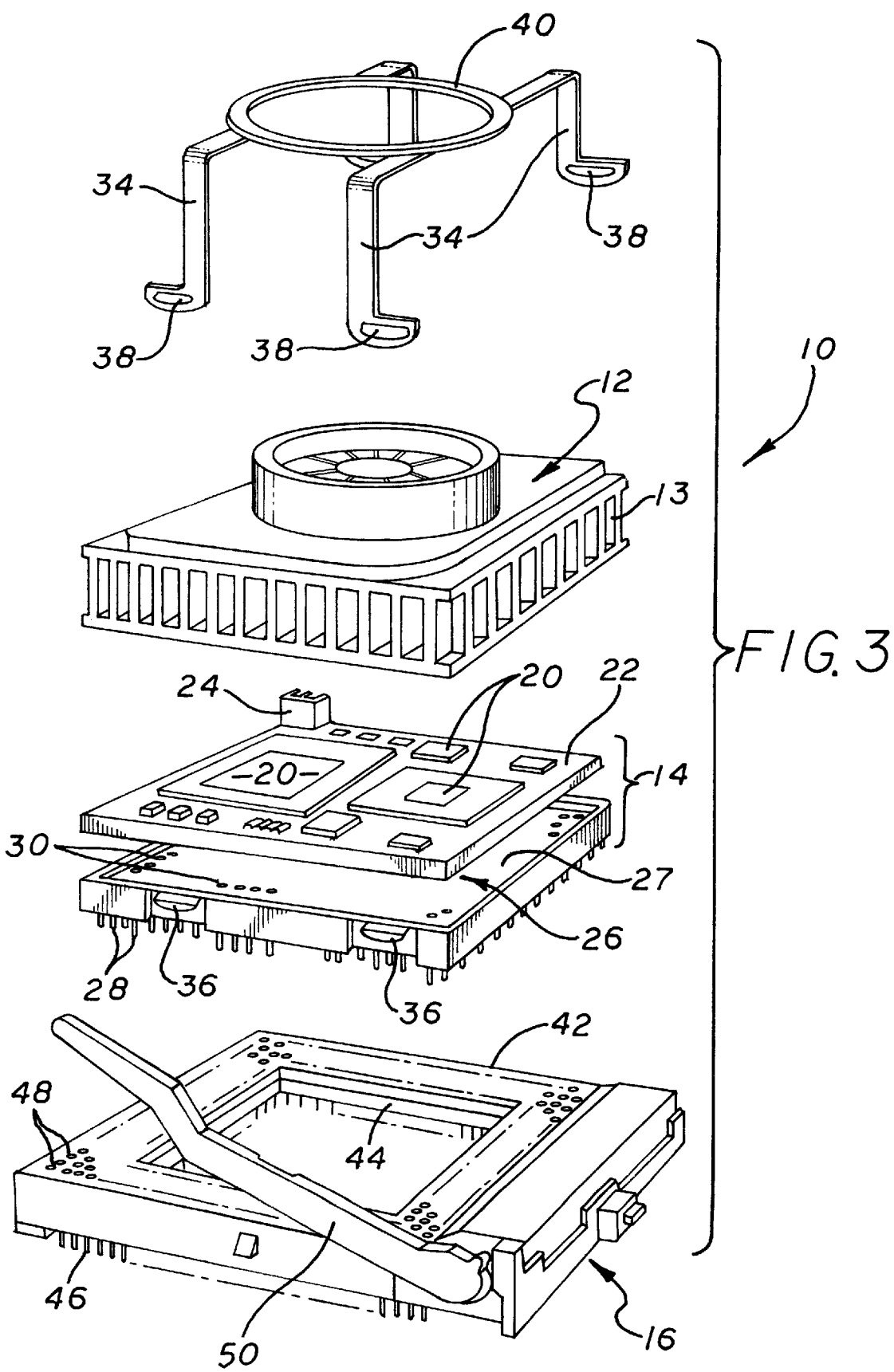
FIG. 3 is an exploded view of the assembly.

Referring to the drawings more particularly by reference numbers, FIGS. 2 and 3 show an electronic assembly 10 of the present invention. The electronic assembly 10 may include a fan 12 that is mounted to a heat sink 13 and attached to a printed circuit board subassembly 14. The subassembly 14 may be plugged into a socket 16 that is mounted to a motherboard 18. The present invention allows a heat sink 13 and fan 12 to be coupled to a socket 16.

The subassembly 14 includes a plurality of integrated circuit packages 20 that are mounted to a substrate 22. The packages 20 contain a number of integrated circuits. By way of example, one of the packages 20 may contain a central processing unit (CPU). Another package 20 may contain a memory device such as a static random access memory (SRAM) device. There may be a pair of packages that contain voltage regulators. The fan 12 may be plugged into a power plug 24 that is mounted to the substrate 22.

The substrate 22 may be mounted to a spacer block 26. The spacer block 26 may include a pin field 27 which has a plurality of pins 28. The pins 28 may be soldered to corresponding surface pads (not shown) located on the bottom surface of the substrate 22. The bottom surface pads of the substrate 22 are electrically connected to the integrated circuit packages 20 by routing traces and power/ground busses of the substrate 22. The substrate 22 can be attached to the spacer block 26 with known surface mount techniques.

The heat sink 13 and fan 12 may be placed on the integrated circuit packages 20. The fan 12 generates an airstream that flows across the fins of the heat sink 13 to cool the packages 20. The heat sink 13 and fan 12 are held in place by a pair of clips 34. The clips 34 wrap around the heat sink 13 and are attached to latches 36 formed in the spacer block 26. There are preferably two latches 36 on each side of the spacer block 26. Each clip 34 is attached to a pair of latches 36 located on opposite sides of the spacer block 26. The latches 36 extend through corresponding eye openings 38 of the clips 34. The clips 34 are connected by an annular wavy spring 40. The wavy spring 40 exerts a spring force which pushes the fan 12 onto the heat sink 13. The clips 34 also push the heat sink 13 into at least one of the integrated circuit packages 20. The spring force reduces the thermal impedance between the packages 20 and the heat sink 13.

The pin field 27 is located on a lid 42 of the socket 16. The lid 42 moves relative to a base 44 of the socket 16. The base 44 contains a plurality of 5B sockets 46 that are attached to the motherboard 18.

The pins 28 of the pin field 27 are inserted into the 5B sockets 46 to couple the integrated circuit packages 20 to the motherboard 18. The lid 42 has a plurality of openings 48 which allow the pins 28 to be plugged into the 5B sockets 46. The socket 16 may have a cam lever 50 that can be rotated by an end user to push the pins 28 into engagement with the 5B sockets 46.

To assemble the electronic package 10, the substrate 22 and accompanying packages 20 are soldered to the pin field 27. The heat sink 13 and fan 12 are then placed on the packages 20 and secured by attaching the clips 34 to the latches 36. The spacer block 26 is then placed onto the socket lid 42 so that the pins 28 extend through the lid openings 48.

The integrated circuit packages 20 can be replaced by initially rotating the cam lever 50 and lid 42 to release the pins 28 from the 5B sockets (not shown) which have pins 46. The spacer block 26 is then removed from the lid 42. The clips 34 are deflected and pulled out of the latches 36 so that the heat sink 13 and fan 12 can be removed from the integrated circuit packages 20.

The heat sink 13, fan 12 and clips 34 are attached to a new substrate 22 which has accompanying integrated circuit packages 20 and a spacer block 26. The pins 28 of the pin field 27 are then plugged into the socket 16 to complete the process of replacing the integrated circuit packages 20.

The present invention provides an electronic assembly which allows a heat sink 13 and fan 12 to be coupled to a socket 16.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic assembly, comprising:
   a socket including a pin socket;
   a spacer block including a latch, and a pin for insertion into said pin socket of said socket;
   a substrate mounted to said spacer block;
   an integrated circuit package mounted to said substrate;
   a heat sink adjacent to said integrated circuit package;
   a fan mounted on said heat sink;
   a clip that is wrapped around both said heat sink and said fan for attachment to said latch of said spacer block.

2. The assembly as recited in claim 1, wherein said clip is connected by a wavy spring that applied pressure to said fan and said heat sink into said integrated circuit package.

3. The assembly as recited in claim 2, wherein said clip includes an eye opening that receives said latch.

4. A method for assembling an electronic assembly, comprising:
   attaching a substrate to a spacer block which has a plurality of pins, said substrate supports an integrated circuit package;
   placing a heat sink onto said integrated circuit package;
   placing a fan onto said heat sink;
   wrapping a clip around said heat sink, said fan and said substrate;
   attaching said clip to said spacer block to secure said heat sink to said integrated circuit package; and,
   plugging said spacer block into a socket.

5. The method as recited in claim 4, further comprising mounting said socket to a motherboard.

6. The method as recited in claim 4, wherein said clip includes a wavy spring that presses said fan and said heat sink into said integrated circuit package.

7. The method as recited in claim 6, wherein said clip includes an eye opening to receive said latch of said spacer block.

8. The method as recited in claim 4, wherein said socket includes a pin socket for receiving one of said plurality of pins.

9. The method as recited in claim 8, further comprising coupling said one of said plurality of pins to said pin socket.

10. The method as recited in claim 8, further comprising releasing said one of said plurality of pins from said pin socket.

11. An electronic assembly comprising:
    a spacer block including a plurality of pins and a latch;
    a substrate placed on said spacer block;
    an integrated circuit package mounted to said substrate;
    a heat sink placed adjacent to said integrated circuit package;
    a fan placed adjacent to said heat sink; and
    a clip that wraps around said heat sink, said fan, and said substrate, said clip being attached to said spacer block.

12. The assembly as recited in claim 11, wherein said clip includes a wavy spring that presses said fan and said heat sink into said integrated circuit package.

13. The assembly as recited in claim 12, wherein said clip includes an eye opening to receive said latch of said spacer block.

14. The assembly as recited in claim 11, further comprising a socket including a pin socket for receiving said pin.

15. The assembly as recited in claim 14, further comprising a motherboard to receive said pin socket of said socket.

16. The assembly as recited in claim 14, wherein said socket further comprises a cam lever for coupling and releasing said pin from said pin socket.

17. A method comprising:
    providing a substrate including an integrated circuit package;
    attaching said substrate to a spacer block, said spacer block including a plurality of pins;
    placing a heat sink onto said integrated circuit package;
    placing a fan onto said heat sink;
    wrapping a clip around said fan and said heat sink;
    attaching said clip to said spacer block; and
    plugging said plurality of pins of the spacer block into a corresponding plurality of pin sockets of a socket.

18. The method as recited in claim 17, wherein said inserting of said plurality of pins includes rotating an adjustable lever of said socket to plug the plurality of pins into said plurality of pin sockets.

19. An electronic assembly comprising:
    a socket;
    a spacer block including a latch;
    a substrate mounted to said spacer block;
    an integrated circuit package mounted to said substrate;
    a heat sink adjacent to said integrated circuit package;
    a fan mounted on said heat sink; and
    a clip that is wrapped around both said heat sink and said fan for attachment to said latch of said spacer block.

20. The assembly as recited in claim 19, wherein said clip is connected by a wavy spring that applied pressure to said fan and said heat sink into said integrated circuit package.

* * * * *